United States Patent
Lan et al.

(10) Patent No.: US 8,373,148 B2
(45) Date of Patent: Feb. 12, 2013

(54) MEMORY DEVICE WITH IMPROVED PERFORMANCE

(75) Inventors: Zhida Lan, San Jose, CA (US); Manuj Rathor, Milpitas, CA (US); Joffre F. Bernard, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/796,073

(22) Filed: Apr. 26, 2007

(65) Prior Publication Data

US 2008/0265240 A1     Oct. 30, 2008

(51) Int. Cl.
  *H01L 45/00*     (2006.01)
(52) U.S. Cl. ............. 257/2; 365/148; 257/E45.003
(58) Field of Classification Search .......... 257/2, 225, 257/260, 261, 296, 300, 326, 390; 365/148
  See application file for complete search history.

(56) References Cited

U.S. PATENT DOCUMENTS

| | | | |
|---|---|---|---|
| 6,423,621 B2 * | 7/2002 | Doan et al. .................. 438/597 |
| 6,507,061 B1 * | 1/2003 | Hudgens et al. ............. 257/295 |
| 6,656,763 B1 * | 12/2003 | Oglesby et al. ................. 438/99 |
| 6,674,115 B2 * | 1/2004 | Hudgens et al. ............. 257/310 |
| 6,686,263 B1 * | 2/2004 | Lopatin et al. ............... 438/584 |
| 6,770,905 B1 * | 8/2004 | Buynoski et al. .............. 257/40 |
| 6,773,954 B1 * | 8/2004 | Subramanian et al. ......... 438/99 |
| 6,825,060 B1 * | 11/2004 | Lyons et al. .................... 438/82 |
| 6,836,398 B1 * | 12/2004 | Subramanian et al. ....... 361/302 |
| 6,847,047 B2 * | 1/2005 | VanBuskirk et al. ........... 257/40 |
| 6,852,586 B1 * | 2/2005 | Buynoski et al. ............. 438/238 |
| 6,878,961 B2 * | 4/2005 | Lyons et al. .................... 257/40 |
| 6,900,488 B1 * | 5/2005 | Lopatin et al. ............... 257/295 |
| 6,936,545 B1 * | 8/2005 | Xie et al. ...................... 438/692 |
| 6,953,720 B2 * | 10/2005 | Moore et al. ................. 438/238 |
| 6,960,783 B2 * | 11/2005 | Lan et al. ........................ 257/40 |
| 6,998,289 B2 * | 2/2006 | Hudgens et al. ............... 438/95 |
| 7,023,014 B2 * | 4/2006 | Morimoto et al. ............. 257/42 |
| 7,102,156 B1 * | 9/2006 | Kingsborough et al. ....... 257/40 |
| 7,259,039 B2 * | 8/2007 | Lan et al. ........................ 438/99 |
| 7,382,647 B1 * | 6/2008 | Gopalakrishnan ............ 365/163 |
| 7,394,088 B2 * | 7/2008 | Lung ................................. 257/2 |
| 7,408,240 B2 * | 8/2008 | Zaidi ............................. 257/613 |
| 7,449,710 B2 * | 11/2008 | Lung ................................. 257/2 |
| 2004/0084670 A1 * | 5/2004 | Tripsas et al. .................. 257/40 |
| 2004/0109351 A1 * | 6/2004 | Morimoto et al. ............ 365/171 |
| 2004/0121261 A1 * | 6/2004 | Ashida et al. ............ 430/270.13 |
| 2004/0160801 A1 * | 8/2004 | Krieger et al. ................ 365/151 |
| 2004/0227136 A1 * | 11/2004 | Lan et al. ........................ 257/40 |
| 2004/0245522 A1 * | 12/2004 | VanBuskirk et al. ........... 257/40 |
| 2005/0174861 A1 * | 8/2005 | Kim et al. ..................... 365/200 |
| 2005/0186737 A1 * | 8/2005 | Sezi et al. ..................... 438/257 |
| 2005/0227382 A1 * | 10/2005 | Hui ................................. 438/14 |
| 2006/0113573 A1 * | 6/2006 | Cheong et al. ................ 257/246 |
| 2006/0175646 A1 * | 8/2006 | Gaun et al. ................... 257/296 |
| 2006/0270232 A1 * | 11/2006 | Kawamura et al. ........... 438/690 |
| 2006/0284158 A1 * | 12/2006 | Lung et al. ........................ 257/2 |

(Continued)

OTHER PUBLICATIONS

Ultra-Low Thermal Conductivity in W/Al2O3 Nanolaminates, R.M. Costescu et al., Science Feb. 13, 2004, vol. 303, No. 5660, pp. 989-990 (Abstract).

*Primary Examiner* — Ha Tran T Nguyen
*Assistant Examiner* — Jordan Klein

(57) ABSTRACT

The present resistive memory device includes first and second electrodes. An active layer is situated between the first and second electrodes. The active layer with advantage has a thermal conductivity of 0.02 W/Kcm or less, and is surrounded by a body in contact with the layer, the body having a thermal conductivity of 0.01 W/Kcm or less.

8 Claims, 5 Drawing Sheets

U.S. PATENT DOCUMENTS

| | | | |
|---|---|---|---|
| 2006/0284214 A1* | 12/2006 | Chen | 257/213 |
| 2007/0108429 A1* | 5/2007 | Lung | 257/2 |
| 2007/0108430 A1* | 5/2007 | Lung | 257/4 |
| 2007/0109836 A1* | 5/2007 | Lung | 365/148 |
| 2007/0115794 A1* | 5/2007 | Lung | 369/163 |
| 2007/0158645 A1* | 7/2007 | Lung | 257/40 |
| 2007/0164267 A1* | 7/2007 | Asano et al. | 257/5 |
| 2007/0173019 A1* | 7/2007 | Ho et al. | 438/257 |
| 2007/0176261 A1* | 8/2007 | Lung | 257/536 |
| 2007/0181932 A1* | 8/2007 | Happ et al. | 257/314 |
| 2007/0215852 A1* | 9/2007 | Lung | 257/4 |
| 2007/0252127 A1* | 11/2007 | Arnold et al. | 257/2 |
| 2008/0017842 A1* | 1/2008 | Happ et al. | 257/4 |
| 2008/0017894 A1* | 1/2008 | Happ et al. | 257/246 |
| 2008/0019170 A1* | 1/2008 | Happ et al. | 365/163 |
| 2008/0138930 A1* | 6/2008 | Lung | 438/102 |
| 2008/0197333 A1* | 8/2008 | Lung | 257/2 |
| 2008/0247214 A1* | 10/2008 | Ufert | 365/148 |

* cited by examiner

MEMORY DEVICE WITH IMPROVED PERFORMANCE

BACKGROUND OF THE INVENTION

1. Technical Field

This invention relates generally to electronic devices, and more particularly, to resistive memory devices.

2. Background Art

FIG. 1 illustrates a two-terminal metal-insulator-metal (MIM) resistive memory device 30. The memory device 30 is typically formed in an opening in a layer of insulating material 31 such as silicon dioxide or silicon nitride. The device includes a metal, for example copper, Cu electrode 32, an active layer 34 of for example $Cu_xO$ on and in contact with the electrode 32, and a metal, for example nickel, Ni electrode 36 on and in contact with the layer 34, with the electrodes and layer in contact with the material of the layer. As an example of the operational characteristics of such a device 30, with reference to FIG. 2, initially, assuming that the memory device 30 is unprogrammed, in order to program the memory device 30, an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an ON-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device 30, an electrical potential $V_{er}$ (the "erase" electrical potential) is applied across the memory device 30 from a higher to a lower electrical potential in the direction of from electrode 32 to electrode 36. (The programming and erasing described above are provided as an example. As another example, the program and erase operations may employ the same bias polarity).

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive OFF state, the memory device 30 will not conduct significant current, which indicates that the memory device 30 is in its erased state.

While such a memory device is effective in operation, it will be understood that improvements in performance, such as improved switching speed and lower power usage, are always desirable. Therefore, what is needed is a memory device which exhibits improved switching speed along with lower power usage.

DISCLOSURE OF THE INVENTION

The present resistive memory device includes first and second electrodes, a layer between the first and second electrodes and within which charge carriers may travel, the layer having a thermal conductivity of 0.02 W/Kcm or less, and a body in contact with the layer and having a thermal conductivity of 0.01 W/Kcm or less.

The present invention is better understood upon consideration of the detailed description below, in conjunction with the accompanying drawings. As will become readily apparent to those skilled in the art from the following description, there is shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
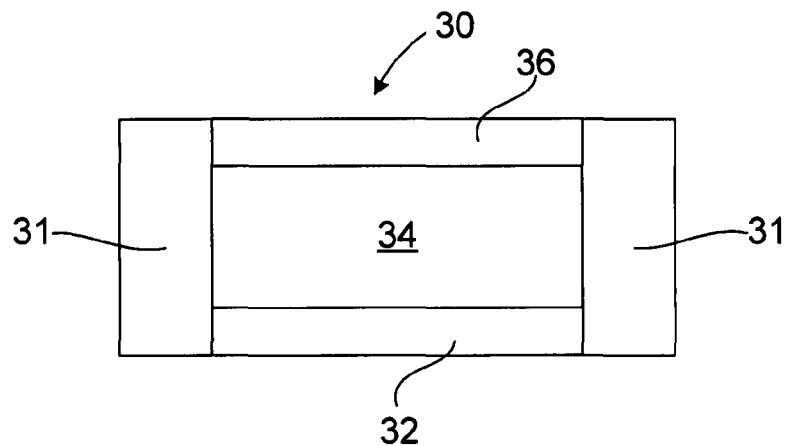
FIG. 1 is a cross-sectional view of an above-described Background Art memory device.
Figure 2:
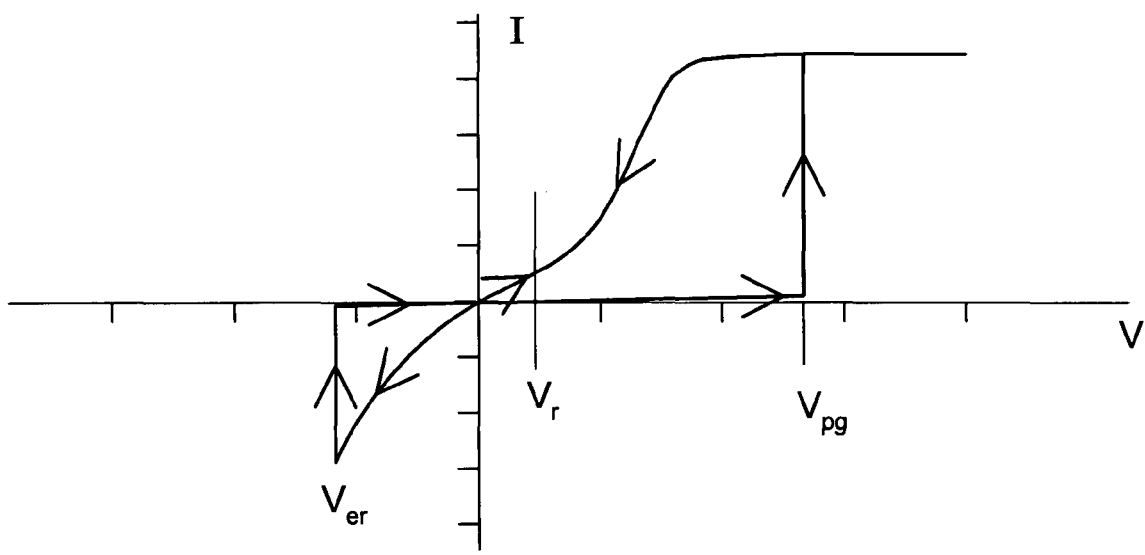
FIG. 2 is a plot of current vs. voltage illustrating operating characteristics of the memory device of FIG. 1.
Figure 3:
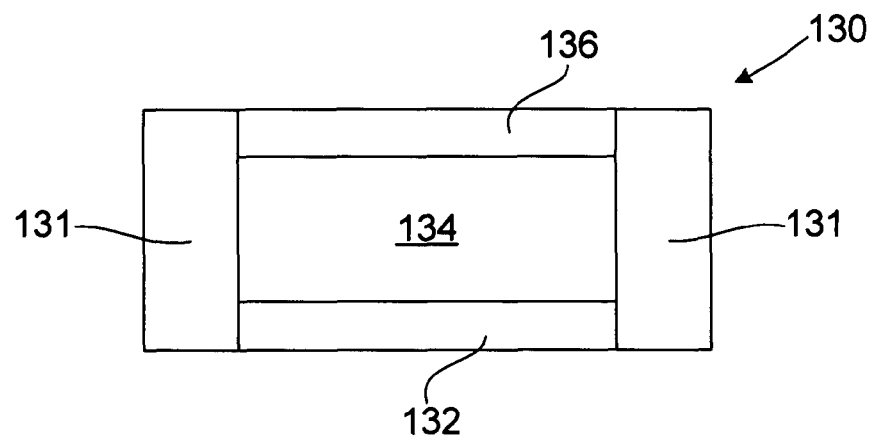
FIG. 3 illustrates a first embodiment of the invention.

FIG. 3 illustrates a first embodiment of resistive memory device 130. Similar to the previously shown and described device 30, the memory device 130 is typically formed in an opening in a layer of insulating material 131 such as silicon dioxide or silicon nitride. The resistive memory device 130 includes an electrically conductive electrode 132 (for example copper, Cu), an insulating (switching) active layer 134 on and in contact with the electrode 132, and an electrically conductive electrode 136 (for example nickel, Ni) on and in contact with the active layer 134, so that the insulating layer 134 is between the electrodes 132, 136. The active layer 134 is made up of a plurality of materials. In a first example, the layer 134 includes a mixture of $Cu_xO$ (copper oxide) and $Cu_xS$ (copper sulfide). While the $Cu_xO$ by itself has a thermal conductivity on the order of 0.055 W/Kcm, where W=power (watts)
K=temperature in ° Kelvin
cm=centimeters The $Cu_xS$ by itself has a thermal conductivity on the order of <0.015 W/Kcm, substantially lower than the thermal conductivity of the $Cu_xO$, and is added to and mixed with the $Cu_xO$ in sufficient quantity to provide a thermal conductivity for the combined materials of 0.02 W/Kcm or less, substantially lower than the $Cu_xO$ alone.

Figure 4:
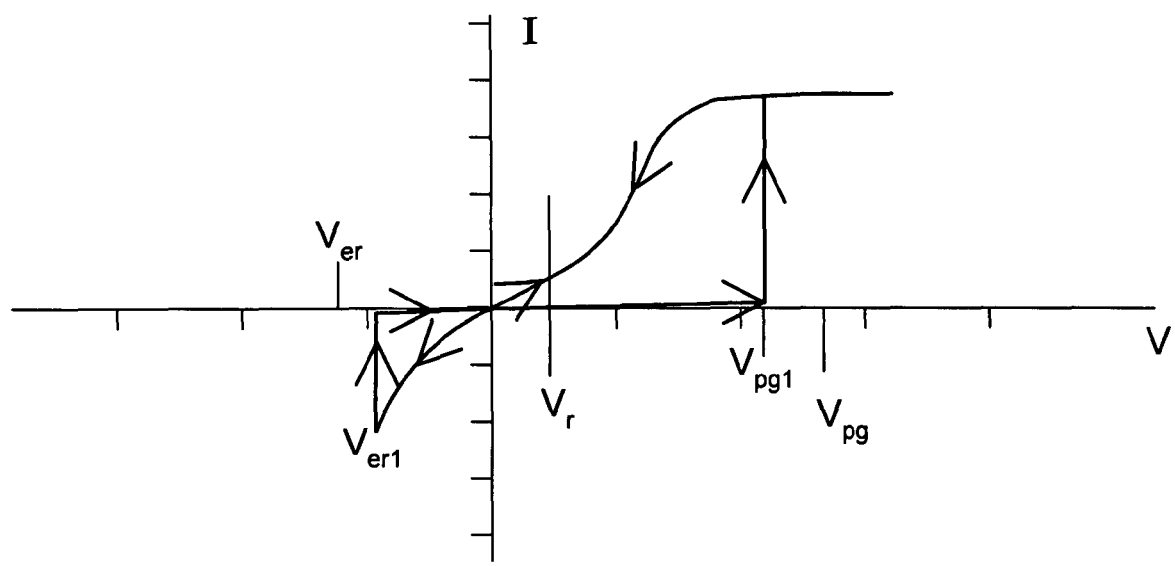
FIG. 4 is a plot of current vs. voltage illustrating operating characteristics of the memory device of FIG. 3.

The switching mechanism is explained based on the Space-Charge-Limited-Conduction (SCLC) model. With reference to FIG. 4, with the memory device 130 in its erased state, in order to program the memory device 130, an electrical potential $V_{pg1}$ (the "program" electrical potential) is applied across the memory device 130 from a higher to a lower electrical potential in the direction of from electrode 136 to electrode 132. This causes electronic charge carriers in the form of electrons and/or holes to enter the active layer 134, resulting in a state change of the memory device, to provide that the overall memory device 130 is in a conductive, low-resistance (programmed) state. Upon removal of such potential the memory device 130 remains in a conductive or low-resistance state having an on-state resistance, due to the long retention associated with the layer 134.

In order to erase the memory device 130, an electrical potential $V_{er1}$ (the "erase" electrical potential) is applied across the memory device 130 from a higher to a lower electrical potential in the direction of from electrode 136 to electrode 132. Application of this electrical potential causes a resulting state change of the device back to its erased state, so that the overall memory device 130 is in a high-resistance (erased) state.

The switching mechanism is based on providing sufficient power to cause electronic state change of the layer 134 and in turn the device 130. This energy is provided by heat in the device 130, in turn generated by current through the device 130. In a device 130 with an active layer of relatively high thermal conductivity, such as $Cu_xO$, heat is not retained, but is rapidly dissipated. Thus heat which could aid in improving the switching process is lost. With the layer of combined $Cu_xO$ and $Cu_xS$ having a substantially greater coefficient of thermal conductivity than the $Cu_xO$ alone, substantially more heat is retained in the device 130 during switching. This results in more rapid switching than in the previously described system. In addition, because of this improvement in heat retention, applied potential for switching can be reduced, resulting in lower switching current, in turn reducing required switching power in accordance with FIG. 4, wherein programming potential $V_{pg1}$ for the device 130 is less than programming potential $V_{pg}$ for the device 30, erase potential $V_{er1}$ for the device 130 is less than programming potential $V_{er}$ for the device 30, and program and erase currents for the device 130 are lower than the program and erase currents for device 30. Since maximum programming and erasing currents through the memory device 130 are low, and programming and erasing voltages are also low, the total power in programming and erasing the device (power=voltage×current) is low. This low power operation is particularly advantageous and desirable in high density memory products, wherein power dissipation can generally be quite high.

Figure 5:
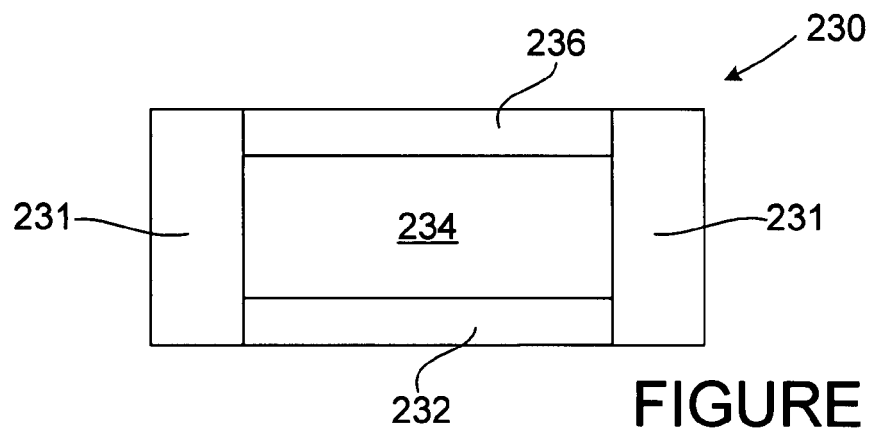
FIG. 5 illustrates a second embodiment of the invention.

FIG. 5 illustrates a second embodiment of resistive memory device 230. Similar to the previously shown and described device 130, the memory device 230 is typically formed in an opening in a layer of insulating material 231 such as silicon dioxide or silicon nitride. The resistive memory device 230 includes an electrically conductive electrode 232 (for example copper, Cu), an insulating (switching) active layer 234 on and in contact with the electrode 232, and an electrically conductive electrode 236 (for example nickel, Ni) on and in contact with the insulating layer 234, so that the active layer 234 is between the electrodes 232, 236. The active layer 234 is made up of a plurality of materials. In a first example, the layer 234 includes a mixture of $Cu_xO$ (copper oxide) and $Ge_xSb_yTe$ (germanium-antimony-tellurium). While the $Cu_xO$ by itself has a thermal conductivity on the order of 0.055 W/Kcm, the $Ge_xSb_yTe$ by itself has a thermal conductivity on the order of <0.01 W/Kcm, substantially lower than the thermal conductivity of the $Cu_xO$, and is added in sufficient quantity to and mixed with the $Cu_xO$ to provide a thermal conductivity of 0.02 W/Kcm or less (in this embodiment with advantage 0.015 W/Kcm) for the combined materials of $Cu_xO$ and $Ge_xSb_yTe$, substantially lower than the $Cu_xO$ alone. With the layer 234 of combined $Cu_xO$ and $Ge_xSb_yTe$ having a substantially lower coefficient of thermal conductivity than the $Cu_xO$ alone, substantially more heat is retained in the device during switching. This results in more rapid switching than in the previously described system. In addition, because of this improvement in heat retention, applied potential for switching can be reduced, resulting in lower switching current, in turn reducing required switching power in accordance with the above description.

Figure 6:
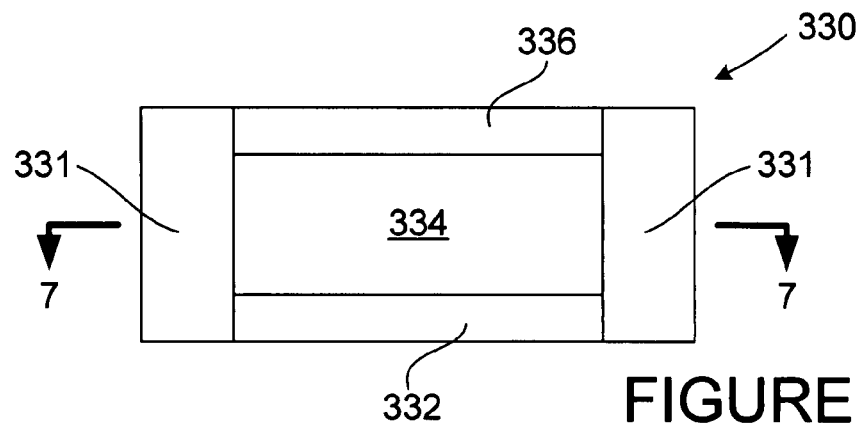
FIG. 6 illustrates a third embodiment of the invention.

FIG. 6 illustrates a third embodiment of resistive memory device 330. Similar to the previously shown and described devices, the memory device 330 is formed in an opening in a layer of material 331. The resistive memory device 330 includes an electrically conductive electrode 332 (for example copper, Cu), an insulating (switching) active layer 334 on and in contact with the electrode 332, and an electrically conductive electrode 336 (for example nickel, Ni) on and in contact with the active layer 334, so that the active layer 334 is between the electrodes 332, 336. The active layer 334 may be made up of a plurality of materials, as described above, or may be of a single material.

Figure 7:
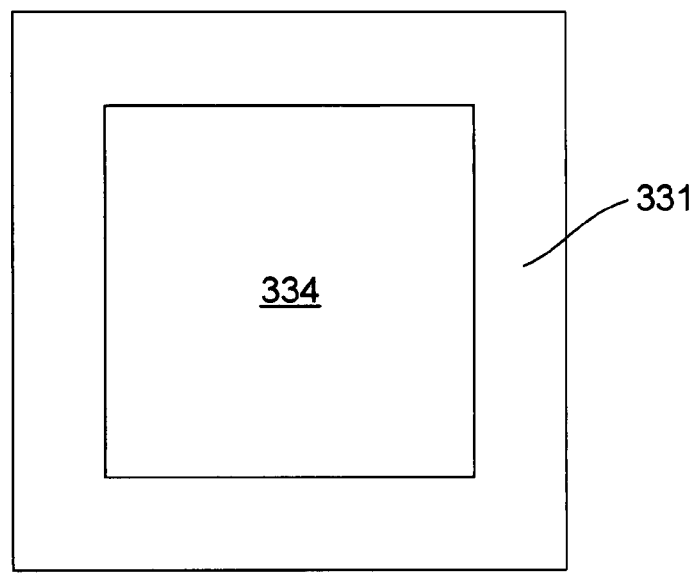
FIG. 7 is a sectional view taken along the line 7-7 of the device of FIG. 6.

As will be seen in FIG. 7, the layer 331 in which the device 330 is provided forms a body in contact with and which surrounding the layer 334 about the outer periphery thereof. The layer 331 has a low thermal conductivity, preferably 0.01 W/Kcm or less, and so may with advantage be formed of nano film $W/Al_xO_y$ (thermal conductivity of 0.006 W/Kcm), $ZrO_x$, $Re_xZr_yO$, or a combination of these materials. The layer 331 of such low thermal conductivity provides a high level of heat retention in the device 330 during switching, as compared with previously described silicon dioxide (thermal conductivity of 0.014 W/Kcm) or silicon nitride (thermal conductivity of ~1 W/Kcm). This in itself provides improved device performance. When combined with an active layer of low thermal conductivity (see first and second embodiments), additional improved performance is achieved.

Figure 8:
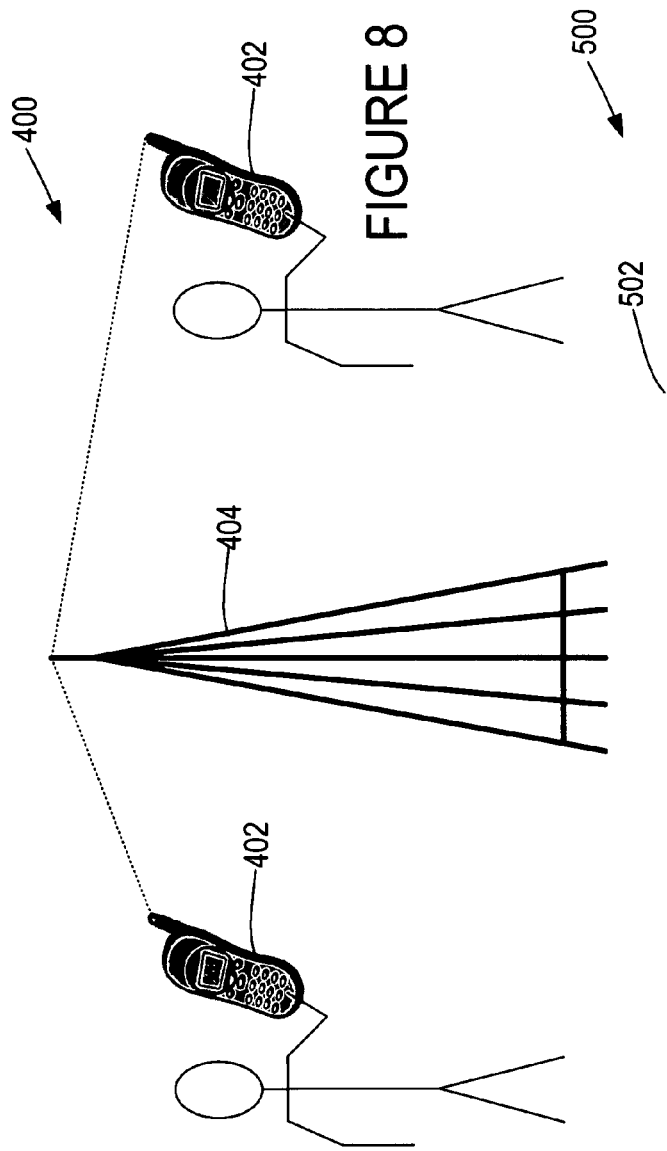
FIGS. 8-10 are systems incorporating memory devices of the present type.

FIG. 8 illustrates a system 400 utilizing memory devices as described above. As shown therein, the system 400 includes hand-held devices 402 in the form of cell phones, which communicate through an intermediate apparatus such as a tower 404 (shown) and/or a satellite. Signals are provided from one cell phone to the other through the tower 404. Such a cell phone with advantage uses memory devices of the type described above for data storage, for example names, telephone number and other data. One skilled in the art will readily understand the advantage of using such memory devices in other hand-held devices 402 which utilize data storage, such as portable media players, personal digital assistants, digital cameras and the like.

Figure 9:
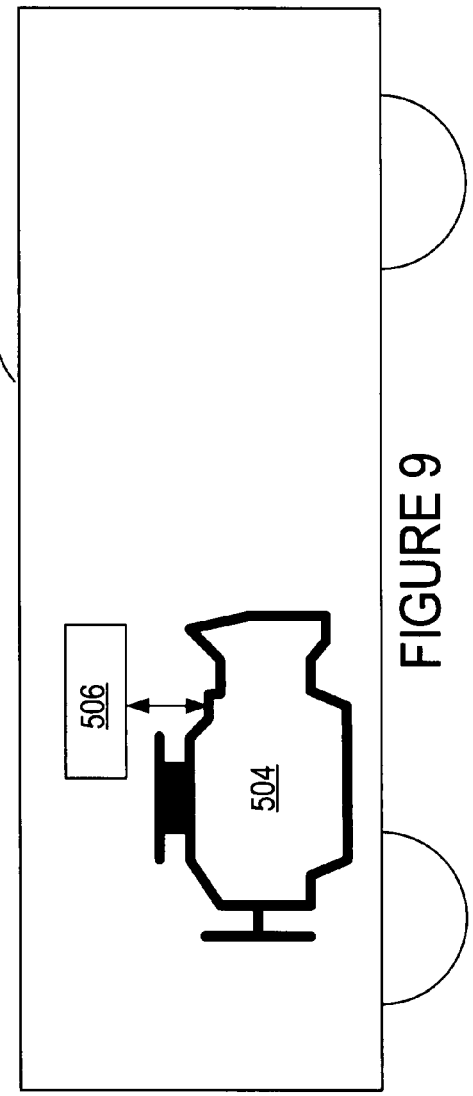

FIG. 9 illustrates another system 500 utilizing memory devices as described above. The system 500 includes a vehicle 502 having an engine 504 controlled by an electronic control unit 506. The electronic control unit 506 with advantage uses memory devices of the type described above for data storage, for example data relating to engine and vehicle operating conditions.

Figure 10:
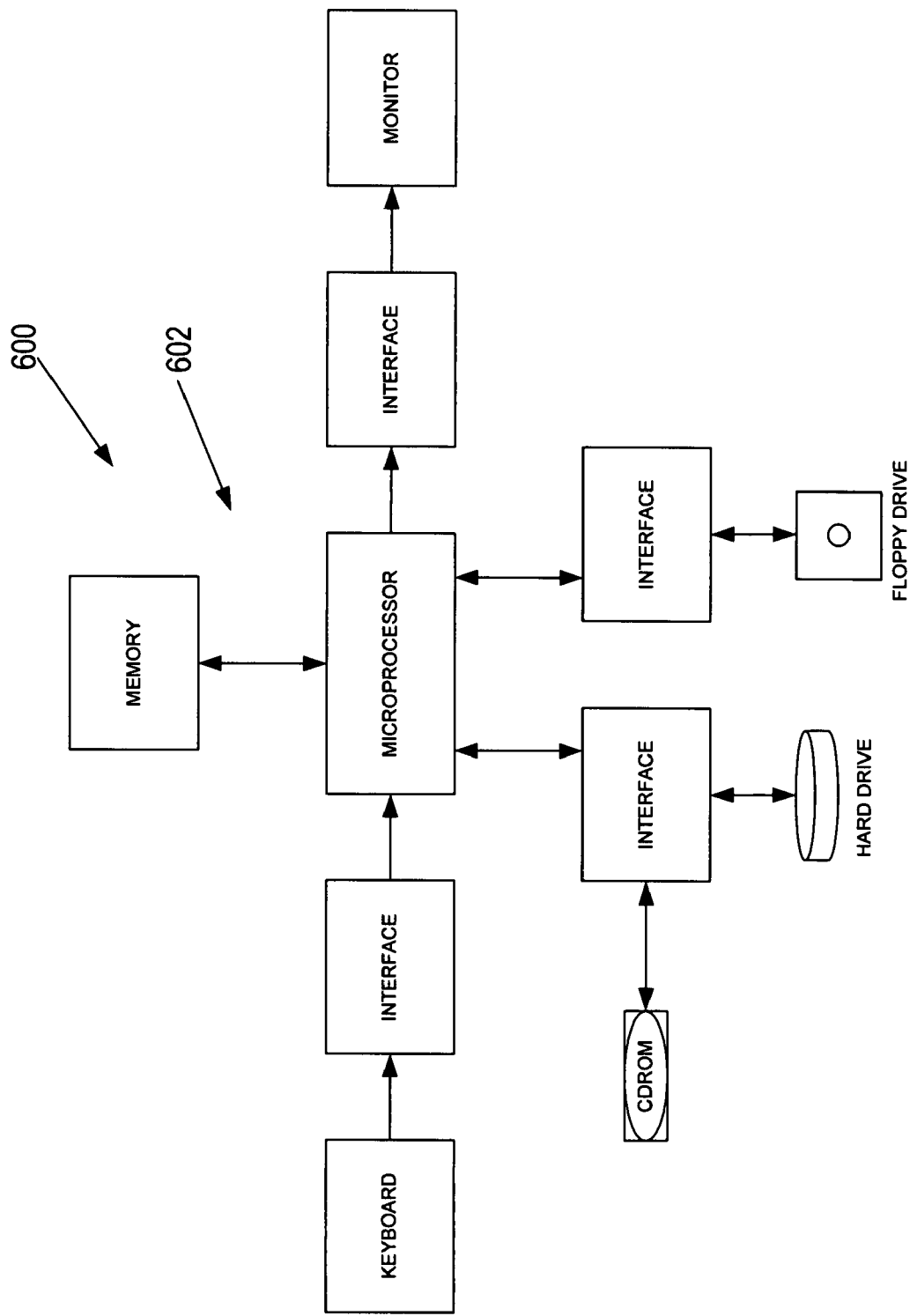

FIG. 10 illustrates yet another system 600 utilizing memory devices as described above. This system 600 is a computer 602 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A resistive memory device comprising:
    first and second electrodes; and
    a layer between the first and second electrodes within which charge carriers travel that has a thermal conductivity of 0.02 W/Kcm or less and comprises $CuO_x$ combined with $Cu_xS$ or $Ge_xSb_yTe$ wherein the layer is on and in contact with the first electrode, and the second electrode is on and in contact with the layer.

2. The memory device of claim 1 and further comprising said memory device incorporated in a system.

3. The memory device of claim 2 wherein the system is selected from the group consisting of a hand-held device, a vehicle, and a computer.

4. A resistive memory device comprising:
    first and second electrodes;
    a layer between the first and second electrodes within which charge carriers travel that has a thermal conductivity of 0.02 W/Kcm or less and comprises $CuO_x$ combined with $Cu_xS$ or $Ge_xSb_yTe$ wherein the layer is on and in contact with the first electrode, and the second electrode is on and in contact with the layer; and
    a body in contact with the layer between the first and second electrodes having a thermal conductivity of 0.01 W/Kcm or less.

5. The memory device of claim 4 wherein the body surrounds the layer about the periphery thereof.

6. The memory device of claim 4 wherein the body surrounds the layer about the periphery thereof.

7. The memory device of claim 4 and further comprising said memory device incorporated in a system.

8. The memory device of claim 7 wherein the system is selected from the group consisting of a hand-held device, a vehicle, and a computer.

* * * * *